United States Patent
Heeger et al.

(10) Patent No.: US 6,878,974 B2
(45) Date of Patent: *Apr. 12, 2005

(54) VISIBLE LIGHT EMITTING DIODES FABRICATED FROM SOLUBLE SEMICONDUCTING POLYMERS

(75) Inventors: Alan J. Heeger, Santa Barbara, CA (US); David Braun, San Luis Obispo, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/223,917

(22) Filed: Aug. 20, 2002

(65) Prior Publication Data

US 2002/0197755 A1 Dec. 26, 2002

Related U.S. Application Data

(60) Continuation of application No. 09/243,173, filed on Feb. 2, 1999, now Pat. No. 6,534,329, which is a continuation of application No. 08/359,883, filed on Dec. 20, 1994, now Pat. No. 5,869,350, which is a division of application No. 07/662,290, filed on Feb. 27, 1991, now Pat. No. 5,408,109.

(51) Int. Cl.[7] .............................................. H01L 21/44
(52) U.S. Cl. ...................................... 257/103; 313/498
(58) Field of Search ......................... 257/103, E33.061, 257/E33.063, E33.064; 313/498, 499

(56) References Cited

U.S. PATENT DOCUMENTS

| | | | |
|---|---|---|---|
| 3,172,862 A | 3/1965 | Gurnee et al. | |
| 3,263,110 A | 7/1966 | Berg | |
| 3,341,915 A | 9/1967 | Knochel et al. | |
| 3,992,203 A | 11/1976 | Hörhold et al. | |
| 4,507,672 A | 3/1985 | Potember et al. | |
| 4,611,385 A | 9/1986 | Forrest et al. | |
| 4,684,353 A | 8/1987 | deSouza | |
| 4,720,432 A | 1/1988 | VanSlyke et al. | |
| 4,769,292 A | 9/1988 | Tang et al. | |
| 4,808,681 A | 2/1989 | Harper et al. | |
| 4,885,211 A | 12/1989 | Tang et al. | |
| 5,009,958 A | 4/1991 | Yamashita et al. | |
| 5,047,687 A | 9/1991 | VanSlyke | |
| 5,059,861 A | 10/1991 | Littman et al. | |
| 5,059,862 A | 10/1991 | VanSlyke et al. | |
| 5,061,569 A | 10/1991 | VanSlyke et al. | |
| 5,073,446 A | 12/1991 | Scozzafava et al. | |
| 5,085,946 A | 2/1992 | Saito et al. | |
| 5,093,691 A | 3/1992 | Utsugi et al. | |
| 5,116,708 A | 5/1992 | Shikatani et al. | |
| 5,142,343 A | 8/1992 | Hosokawa et al. | |
| 5,171,373 A | 12/1992 | Hebard et al. | |
| 5,185,208 A | 2/1993 | Yamashita et al. | |
| 5,213,983 A | 5/1993 | Gustafsson et al. | |
| 5,232,631 A | 8/1993 | Cao et al. | |
| 5,247,190 A | 9/1993 | Friend et al. | |
| 5,317,169 A | 5/1994 | Nakano et al. | |
| 5,331,182 A | 7/1994 | Takimoto et al. | |
| 5,331,183 A | 7/1994 | Sariftci et al. | |
| 5,334,539 A | 8/1994 | Shinar et al. | |
| 5,408,109 A | 4/1995 | Heeger et al. | |
| 5,443,921 A | 8/1995 | Hosokawa et al. | |
| 5,705,284 A | 1/1998 | Hosokawa et al. | |
| 5,726,457 A | 3/1998 | Nakano et al. | |
| 5,869,350 A | 2/1999 | Heeger et al. | |

FOREIGN PATENT DOCUMENTS

| | | |
|---|---|---|
| CA | 2037917 | 2/1991 |
| EP | 0 319 881 | 6/1989 |
| EP | 0 423 283 | 4/1991 |
| EP | 0 443 861 | 8/1991 |
| EP | 0 573 549 | 5/1998 |
| JP | 59-181681 | 10/1984 |
| JP | 60-95979 | 5/1985 |
| JP | 60-149177 | 8/1985 |
| JP | 61-226974 | 10/1986 |
| JP | 63-133682 | 6/1988 |
| JP | 63-264692 | 11/1988 |
| JP | 63-295695 | 12/1988 |
| JP | 2-223188 | 9/1990 |
| JP | 2-251428 | 10/1990 |
| JP | 2-282263 | 11/1990 |
| JP | 3-20992 | 1/1991 |
| JP | 3-29293 | 2/1991 |
| JP | 3-244630 | 10/1991 |
| JP | 3-274693 | 12/1991 |
| JP | 4-202394 | 7/1999 |
| WO | WO 90/13148 | 11/1990 |
| WO | WO 92/03490 | 3/1992 |
| WO | WO 92/16023 | 9/1992 |
| WO | WO 92/22911 | 12/1992 |
| WO | WO 98/10621 | 3/1998 |

OTHER PUBLICATIONS

Derwent WPI, INPADOC record of JP 2–223188.
Derwent WPI, INPADOC record of JP 3–244630.
Derwent WPI, INPADOC record of JP 3–274693.
Derwent WPI, INPADOC record of JP 3–29293.
Derwent WPI, INPADOC record of JP 63–264692.
JAPIO, Derwent WPI, INPADOC record of JP 59–181681.
JAPIO, Derwent WPI, INPADOC record of JP 60–149177.
JAPIO, Derwent WPI, INPADOC record of JP 60–95979.
JAPIO, Derwent WPI, INPADOC record of JP 61–226974.
JAPIO, Derwent WPI, INPADOC record of JP 63–133682.
Adachi et al., (1988). "Organic Electroluminescent Device with a Three–Layer Structure," *Jpn. J. Appl. Phys.*, 27(4):L713–L715.

(Continued)

Primary Examiner—George Fourson
(74) Attorney, Agent, or Firm—Morrrison & Foerster LLP

(57) ABSTRACT

Visible light LEDs are produced having a layer of conjugated polymer which is cast directly from solution or formed as a gel-processed admixture with a carrier polymer. The LEDs can be formed so as to emit polarized light.

69 Claims, No Drawings

OTHER PUBLICATIONS

Adachi et al., (1990). "Confinement of Charge Carriers and Molecular Excitons Within 5–nm–thick Emitter Layer in Organic Electroluminescent Devices with a Double Heterostructure," *Appl. Phys. Lett.,* 57(6):531–533.

Adachi et al., (1989). "Organic electroluminescent device having a hole conductor as an emitting layer," *Appl. Phys. Lett.,* 55(15):1489–1491.

Adachi et al., (1990). "Blue light–emitting organic electroluminescent devices," *Appl. Phys. Lett.,* 56(9):799–801.

Allen, (1991). "Impact Processes in Electroluminescence," *J Lumin.* 48&49:18–22.

Arbogast, J., et al., (1991). "Photophysical properties of C60," *J. Phys. Chem.,* 95:11–12.

Askari et al., (1988). "Substituted–PPV Conducting Polymers: Rigid Rod Polymers with Flexible Side Chains," *Proc. ACS Div. Polym Mat. Sci. Eng.,* 59:1068–1070.

Bloor (1992). "Tunable polymer diodes," *Nature* 356:19–20.

Bradley et al., (1989). "Light–induced Luminescence Quenching in Precursor–route Poly(p–phenylene vinylene)," *J. Phys.: Cond. Matter* 1:3671–3678.

Bradley et al., (1991). "Light Emission from Poly(p–phenylene vinylene): A Comparison Between Photo– and Electro–luminescence," *Synthetic Metals,* 41–43:3135–3141.

Bradley, (1991). "Molecular electronics–aspects of the physics," *Chemistry In Britain,* Aug. 1991; pp. 719–723.

Braun et al., (1991). "Improved Efficiency In Semiconducting Polymer Light–Emitting Diodes," *J. Electron. Mat* 20(11):945–948.

Braun et al., (1991). "Visible Light Emission from Semiconducting Polymer Diodes," *Appl. Phys. Lett.,* 58(18):1982–1984.

Braun et al., (1993). "Transient Electroluminescence From Polymer Light Emitting Diodes," *Synthetic Metals* (presented at the Int'l Conf. on Science and Technology on Synthetic Metals, Goteborg, Sweden in Aug. 1992), 55–57:4145–4150.

Brèdas et al., (1985). "Polarons, Bipolarons and Solitons in Conducting Polymers" *Accounts Chem Research,* 18:309–315.

Brown et al., (1992). Poly($\rho$–phenylenevinylene) lightemitting diodes: Enhanced electroluminescent efficiency through carrier confinement, *Appl. Phys. Lett.,* 61(23):2793–2795.

Brown et al., (1993). "Optical Probes of Electronic States Injected into Poly(P–Phenylenevinylene) Electroluminescent Devices," *Synthetic Metals* (presented at the Int'l Conf. on Science and Technology on Synthetic Metals, Goteborg, Sweden in Aug. 1992), 55–57:4117–4122.

Burn et al., (1992). "Chemical Tuning of Electrochemiluminescent Copolymers to Improve Emission Efficiencies and Allow Patterning", *Nature,* 356:47–49.

Burroughes et al., (1990). "Light–emitting diodes based on conjugated polymers," *Nature,* 347:539–541.

*C&EN,* (Oct. 15, 1990). "Science–Polymer Lights up flat screen displays," p. 26.

Cacialli et al., (1994). "Characterization of properties of polymeric light–emitting diodes over extended periods," *Synthetic Metals,* 67:157–160.

Cacialli et al., (1998). "Naphthalimide side–chain polymers for organic light–emitting diodes: Band–offset engineering and role of polymer thickness," *Journal Of Applied Physics,* 83(4):2343–2356.

Cao et al. (1998). "Efficient, Low Operting Voltage Polymer Light–Emitting Diodes with Aluminum as the Cathode Material," *Adv. Mater.* 10(12):917–920.

Colvin et al., (1994). "Light–emitting diodes made from cadmium selenide nanocrystals and a semiconducting polymer," *Nature,* 370:354–357.

D. Braun, et al., (1992). "Electroluminescence and electrical transport in poly(3–octylthiophene) diodes," *J. Appl. Phys* 72(2):564–568.

Document E20 from European Opposition to EP Patent Publication No. 0 573 549 corresponding to "Performance Comparison Between a PPV/A1 Device and a MEH–PPV/Ca Device," 4 pages.

Document E21 from European Opposition to EP Patent Publication No. 0 573 549 corresponding to "Table of Publications Reporting Quantum Efficiency Measurements on Single Layer Precursor Route PPV Devices," 1 page.

Feast, "Synthesis of Conducting Polymers," Chapter 1 in Skotheim, (1986) editor, *Handbook of Conducting Polymers* (Marcel Dekker, Inc., New York), vol. 1, pp. 1–43.

Fox, M.A., et al., (1988). "Coneptual Basis," in *Photoinduced Electron Transfer,* Elsevier Science Publishers, Amsterdam, Table of Contents for Part A.

Fox, M.A., et al., (1988). "Photoinduced Electron Transfer Reactions: Inorganic Substrates and Applications" in *Photoinduced Electron Transfer,* Elsevier Science Publishers, Amsterdam, Part D, Table of Contents for Part D.

Greenham et al., (1993). "Electroluminescent devices made with conjugated polymers," *Proc. SPIE* Electroluminescent Materials, Devices, and Large–Screen Displays, Esther M. Conwell; Milan Stolka; M. Robert Miller; Eds., 1910:84–91.

Grem, et al., (1992). "Realization of a Blue–Light–Emitting Device using poly($\rho$–phenylene)," *Adv. Mater.,* 4:36–37.

Gustafsson et al., (Jun. 1992). "Flexible Light–Emitting Diodes Made From Soluble Conducting Polymers," *Nature,* 357:477–479.

Hagler et al., (1991). "Enhanced order and electronic delocalization in conjugated polymers oriented by gel processing in polyethylene," *Physical Review B,* 44(16):8652–8666.

Hagler et al., (1991). "Highly ordered conjugated polymers in polyethylene: Orientation by mesoepitaxy," *Polymer Comm.,* 32(11):339–342.

Heeger (1989). "Charge Transfer in Conducting Polymers," *Faraday Discuss. Chem Soc.,* 88:203–211.

Heeger et al., (1988). "Solitons in conducting polymers" *Reviews of Mod. Phys.,* 60:782–850.

Herold et al., (1996). "Tailoring of the electrical and optical properties of poly($\rho$–phenylene vinylene)," *Synthetic Metals,* 76:109–112.

Holmes et al., (1993). "Photoluminescence And Electroluminescence In Conjugated Polymeric Systems," *Synthetic Metals,* 55–57:4031–4040.

Hotta et al., (1987). "Spectroscopic Studies of Soluble Poly(3–alkylthienylenes" *Macromolecules,* 20:212–215.

Hurych, (1966). "Influence of Non–Uniform Thickness of Dielectric Layers on Capacitance and Tunnel Currents." *Solid–St. Electron.* 9:967–979.

Hurych, (1970). "Tunnel Current Through $Al–Al_2O_3–Al$ Structures in the Case of Non–Uniform $Al_2O_3$ Layer Thickness," *Solid–St. Electron.* 13:683–695.

Hwang et al., (1974). "On the Theory of Filamentary Double Injection and Electroluminescence in Molecular Crystals," *J. Chem. Phys.,* 60(10):3845–3855.

IEEE Standard Dictionary of Electrical and Electronics Terms, 3rd Edition 1984, p. 1026.

Ikenoue et al., (1988). "Verification of the "Cation–Popping" Doping Mechanisms of Self–Doped Polymers" *J. Am. Chem. Soc.* 110:2983–2895.

Ivey, (1966). "Electroluminescence and Semiconductor Lasers," *IEEE J. Quantum Elec.,* QE–2(11):713–726.

J. Gmeiner, et al., (1993). "Synthesis, electrical conductivity and electroluminescence of poly(p–phenylene vinylene) prepared by the precursor route," *Acta Polymer.* 44:201–205.

Jarzebski, (1982). "Preparation and Physical Properties of Transparent Conducting Oxide Films," *Phys. Stat. Sol.,(a)* 71:13–41.

Jen et al., (1985). "Processible And Environmentally Stable Conducting Polymers" *Polym. Materials: Sci. Eng.,* 53:79–83.

Jen et al., (1986). "Highly Conducting, Soluble, and Environmentally–Stable Poly(3–Alkylthiophenes)," *J. Chem. Soc. Chem. Commun.,* pp. 1346–1347.

Jenekhe et al., (1990). "Complexation Mediated Solubilization and Processing of Rigid–Chain and Ladder Polymers in Aprotic Organic Solvents," *Macromolecules,* vol. 23, No. 20, pp. 4419–4429.

Kajigaeshi et al., (1987). "Iodination of Phenols by Use of Benzyltrimethylammonium Dichloroiodate (1–)," *Chemistry Letters,* pp. 2109–2112.

Kajigaeshi et al., (1988). "Iodination of Aromatic Ethers by Use of Benzyltrimethylammonium Dichloroiodate and Zinc Chloride," *Chemistry Letters,* pp. 795–798.

Kalinowski et al., (1975). "Magnetic Field Effects on Recombination Radiation in Tetracene Crystal," *Chemical Physics Letters,* 36(3):345–348.

Kamat, P., (1991). "Photoinduced charge transfer between fullerenes (C60 and C70) and semiconductor ZnO colloids," *J. Am, Chem. Soc.,* 113:9705–9707.

Karg et al., (1997). "Light–emitting diodes based on poly–p-phenylene–vinylene: I. Charge–carrier injection and transport," *J. Appl. Phys.,* 82(4):1951–1960.

Kathirgamanathan, (1988). "Review: Inherently Conductive Polymers and Their Commercial Potential," *High Performance Plastics,* 5(5):1–5.

Kawabe et al., (1971). "Electroluminescence of Green Light Region in Doped Anthracene," *Japan. J. Appl. Phys.* 10:527–528.

Kholuyanov, (1962). "Light Emission Associated with Breakdown in Silicon Carbide p–n Junctions," *Sov. Phys. Solid State,* 3(11):2405–2407.

Kim et al., (1998). "Indium–tin oxide treatments for single– and double–layer polymeric light–emitting diodes: The relation between the anode physical, chemical, and morphological properties and device performance," *Journal Of Applied Physics,* 84(12):6859–6870.

Kivelson et al., (1988). "Intrinsic Conductivity Of Conducting Polymers" *Synth. Met.* 22:371–384.

Koezuka et al., (1985). "Organic Hetrojunctions utilizing two conducting polymers: Poly(acetylene)/poly(N–methylpyrrole) junctions," *J. Appl. Phys.,* 58:1279–1284.

Kraft et al., (1993). "Hole–Transporting Compounds For Multi–Layer Polymer Light–Emitting Diodes," *Synthetic Metals,* 55–57:4163–4167.

Kroemer, (1963). "A Proposed Class of Heterojunction Injection Lasers," *Proc. IEEE* 51:1782–1783.

Kroemer, (1975). "Problems in the Theory of Heterojunction Discontinuities," *CRC Critical Reviews in Solid State Sciences* 5(4):555–564.

Larousse, (1995). Dictionary of Science and Technology, ed. by P.M. B. Walter, p. 1195.

Lazzaroni et al., (1990). "Electronic Structure of Processable Conducting Polymers," in *Conjugated Polymeric Materials: Opprotunities in Electronics, Optoelectronics and Molecular Electronics,* J. L. Brèdas, R. R. Chance, Eds., Klumer Academic Publishers, Dordrecht, pp. 149–162.

Lehmann, (1966). "Edge Emission of n–Type Conducting ZnO and CdS," *Solid–St. Electron.* 9:1107–1110.

Livingstone et al., (1973). "Electroluminscence in Forward–Biased Zinc Selenide Schottky Diodes," *Solid–St. Elec.* 16:351–356.

Makoto et al., (Aug. 1985). "Manufacture of Photoelectric Conversion Element," JAPIO Abstract corresponding to published Japanesen patent application No. JP 60–149177.

Morgado et al., (1999). "Luminescence properties of poly(p–phenylenevinylene): Role of the conversion temperature on the photoluminescence and electroluminescence efficiencies," *Journal of Applied Physics,* 85(3):1784–1791.

Neubert et al., (1978). "Preparation of Liquid Crystal Intermediates: 4–Substituted Alkoxybenzenes," *Mol Cryst. Liq. Cryst.,* 44:197–210.

Nohara et al., (1989). "A new series of electroluminescent organic compounds," *Chemistry Letters* pp. 189–190.

Nowak et al., (1987). "Polarons and Bipolarons on a Conducting Polymer in Solution" *Macromolecules,* 20:965–968.

Nowak et al., (1989). "Charge Storage on a Conducting Polymer in Solution" *Macromolecules,* 22:2917–2926.

O. Inganäs, et al., (1991). "Melt Processable Polymer Electronics," *Synthetic Metals* 41–43:1095–1101.

Ohmori er al., (1991). "Blue Electroluminescent Diodes Utilizing Poly(alkylfluorene)," *Japanese Journal of Applied Physics,* 30(11B):L1941–L1943.

Okamoto et al., (1987). "DC Gas–Discharge Display Panel with $LaB_6$ Thin–Film Cathode," *Jpn. J. Appl. Phys.* 26(10):1722–1726.

P. L. Burn, et al., (1991). "Studies On The Efficient Synthesis Of Poly(Phenylenevinylene) (PPV) And Poly-(Dimethoxy Phenylenevinylene) (Dimethoxy–PPV)," *Synthetic Metals* 41–43:261–264.

Paasche et al., (1989). "Amorphous–SIC thin–film p–i–n light–emitting diode using amorphous–SIN hot–carrier tunneling injection layers," *IEEE Transactions on Electron Devices,* 36(12):2895–2901.

Park, Y. et al., (1996). "Work Function of Indium Tin Oxide Transparent Conductor Measured by Photoelectron Spectrocopy," App. Phys. Lett 68(19):2699–2701.

Parker, (1994). "Carrier Tunneling and Device Characteristics in Polymer Light–Emitting Diodes," *J. Appl. Phys.,* 75(3):1656–1666.

Partidge et al., (1983). "Electrochemiluminescence from polyvinylcarbazole films: 4. Electrochemiluminescence using higher work function cathodes," *Polymer,* 24:755–762.

Partridge (1983). "Electroluminescence from polyvinylcarbazole films: 1. Carbazole cations," *Polymer* 24:733–738.

Partridge (1983). "Electroluminescence from polyvinylcarbazole films: 2. Polyvinylcarbazole films containing antimony pentachloride," *Polymer* 24:739–747.

Partridge (1983). "Electroluminescence from polyvinylcarbazole films: 3. Electroluminescent devices," *Polymer* 24:748–754.

Partridge, (1983). "Electrochemiluminescence from polyvinylcarbazole films 4. Electrochemiluminescence using higher work function cathodes," *Polymer,* 24:755–762.

Patil et al., (1987). "Self–Doped Conducting Polymers" *Synth. Met.* 20:151–159.

Patil et a., (1987). "Water–Soluble Conducting Polymers" J. Am. Chem. Soc. 109:1858–1859.

Pichler et al., (1993). "Photoinduced Absorption of Structurally Improved Poly(P–Phenylene Vinylene)–No Evidence for Bipolarons," *Synthetic Metals, (Int'l Conf. on Science and Technology on Synthetic Metals, Goteborg, Sweden)* 55–57:230–234.

Pope et al., (1982). in *Electronic Processes in Organic Crytals,* Clarendon Press, Oxford, pp. 508–509.

Rughoopath et al., (1987). "Soluble Conducting Polymers: The poly (3–alkylthienylenes)," *Synthetic Metals,* 21:41–50.

Rughooputh et al., (1987). "Chromism of Soluble Polythienylenes" *J. Polym. Sci.: Part B: Polym. Phys.,* 25:1071–1078.

Sato et al., (1986). "Soluble Conducting Polythiophenes" *J. Chem Soc. Chem. Commun.* 295:873–874.

Shi et al., (1990). "Synthesis and Characterization of a Water Soluble Poly(p–phenylenevinylene) Derivative," *Macromolecules,* 23:2199–2124.

Shi, et al., (1990). "Synthesis and Characterization of a Water Soluble PPV Derivative," *Conjugated Polymeric Materials: Opportunities in Electronics, Optelectronics and Molecular Electronics* Ed. by J.L. Bredas and R.R. Chance, NATO ASI Series, Series E: Applied Science, Kluwer Academic Publishers, Dordrecht, 82:83–89.

Shinar et al., (1993). "Optically Detected Magnetic Resonance Studies of–Conjugated Polymer–Based Light Emitting Diodes," presented at SPIE/IS&T Symposium on Electronic Imaging: Science and Technology; San Jose, California; Jan. 31–Feb. 4, 1993, *Proc. SPIE* 1910:147–159.

Skotheim, editor, (1986). *Handbook of Conducting Polymers,* Marcel Dekker, Inc., New York, vol. 1, pp. 1–43.

Smith et al., (1981). "Ultra–drawing of High Molecular Weight Polyethylene Cast From Solution. III. Morphology and Structure," *Colloid & Polymer Science,* 259:1070–1080.

Surridge et al., (1989). "Electron Self–exchange Dynamics between Redox Sites in Polymers," *Faraday Discuss. Chem. Soc.,* 88:1–17.

Swanson et al., (1993). "Photoluminescence, Electroluminescence, and Optically Detected Magnetic Resonance Study of 2, 5–Dialkoxy Derivatives of Poly(P–Phenyleneacetylene) (PPA) and PPA–Based Light–Emitting Diodes," *Synthetic Metals* (presented at the Int'l Conf. on Science and Technology on Synthetic Metals, Goteborg, Sweden, Aug. 1992), 55–57:1–6.

Swanson et al.,(1993). "Poly(P–Phenyleneacetylene) (PPA) Based Light Emitting Diodes," presented at SPIE/IS&T Symposium on Electronic Imaging: Science and Technology; San Jose, California; Jan. 31–Feb. 4, 1993, *Proc. SPIE* 1910:101–110.

Sze, (1981). in: *Physics of Semiconductor Devices,* 2nd ed., John Wiley & Son, Inc. New York, New York, pp. 250–251.

Sze, (1981). "Photodetectors," Chapter 13, in: *Physics of Semiconductor Devices,* 2nd ed., John Wiley & Son, Inc. New York, New York, pp. 743–789.

Sze, (1981). "Solar Cells," Chapter 14, in: *Physics of Semiconductor Devices,* 2nd ed., John Wiley & Son, Inc. New York, New York, pp. 790–838.

T. Tsutsui, et al., (1991). "Electroluminescence In Multilayer Organic Dye Films," *Synthetic Metals* 41–43:1193–1196.

Tang et al., (1987). "Organic electroluminescent diodes," *Appl. Phys. Lett.,* 51(12):913–915.

Tang et al., (1989). "Electroluminescence of doped organic thin films," *J. Appl. Phys.,* 65(9):3610–3616.

Termonia et al., (1988). "A Theoretical Approach To the Calculation Of The Maximum Tensile Strength Of Polymer Fibers," Chapter 11, *High Modulus Polymers—Approaches to Design and Development,* (Zachariades, A.E. and Porter, R.S., eds., Marcel Dekker, Inc.: New York, pp 321–362.

Tomozawa et al., (1987). "Metal–Polymer Schottky Barriers on Cast Films of Soluble Poly(3–alkylthiophenes)," *Synthetic Metals,* 22:63–69.

Tomozawa et al., (1989). "Metal–polymer Schottky barriers on processible polymers" *Synthetic Metals,* 28(1&2):C687–C690.

Uchida et al., (1987). "Electrical Properties of Thermally Stable $LaB_6$/GaAs Schottky Diodes," *Appl. Phys. Lett.,* 50(11):670–672.

Uchiike, (1989). "Review of Flat Panel Displays: Electroluminescent Displays, Liquid Crystal Displays, etc.," in Electroluminescence S. Shionoya, H. Kobayashi, Eds. *Springer Proceedings in Physics,* (Springer–Verlag, Berlin) 38:238–245.

Väkiparta et al., (1991). "Temperature Dependence of DC–Conductivity in Poly(3–alkylthiophenes) in Temperature Regime 20–400K," *Synth. Met.,* 41–43:903–906.

Vincett et al., (1982). "Electrical conduction and low voltage blue electroluminescence in vacuum–deposited organic films," *Thin Solid Films,* 94:171–183.

Voit et al., (1988). "Fluctuation–Induced Tunneling and the Conduction Mechanism in Metallic Polyacetylene," *Solid State Commun.,* 67(12):1233–1237.

Voss et al., (1991). "Substitution Effects on Bipolarons in Alkoxy Derivatives of Poly(1,4–phenylene–vinylene)," *Phys. Rev.,* B 43(6):5109–5118.

Wang, (1992). "Photoconductivity of fullerene–doped polymers," *Nature,* 356:585–587.

Williams et al., (1987). "Lanthanum hexaboride ($LaB_6$) Resistivity Measurement," *Appl. Phys. Lett.* 50(25):1844–1845.

Winter et al., (1983). "Control of Schottky–diode–barrier Height by Langmuir–Blodgett Monolayers," *IEEE Proc.* 130 Pt. 1(5):256–259.

Wittmann et al., (1991). "Highly Oriented Thin Films of Poly(tetrafluoroethylene) as a Substrate for Oriented Growth of Materials," *Nature,* 352:414–417.

Wudl et al., (1991). "Polymers and an unusal molecular crystal with nonlinear optical properties," Chapter 46, in: *Materials for Nonlinear Optics: Chemical Perspectives,* Amer. Chem. Soc., vol. 455, pp. 683–686.

Yokoyama et al., (1990). "Evaluation of $LaB_6$ Thin Film as Low–Work Function Gate for MOSFET Operated at Low Temperature," *Jpn. J. Appl. Phys.* 29(9):L1594–L1596.

Yoshino et al., (1987). "Conducting polymer fibre prepared by melt–spinning method from fusible polythiophene derivative" *Polymer Commun.* 28:309–310.

Zener et al., (1934). "A Theory of the Electrical Breakdown of Solid Dielectrics," *Proc. Royal Soc. London* A 145:523–529.

VISIBLE LIGHT EMITTING DIODES FABRICATED FROM SOLUBLE SEMICONDUCTING POLYMERS

RELATED APPLICATIONS

This application is a continuation of U.S. patent application Ser. No. 09/243,173 filed Feb. 2, 1999, now U.S. Pat. No. 6,534,329, which is in turn a continuation of U.S. patent application Ser. No. 08/359,883 filed Dec. 20, 1994, now U.S. Pat. No. 5,869,350, which is a division of U.S. patent application Ser. No. 07/662,290 filed Feb. 27, 1991, now U.S. Pat. No. 5,408,109.

GOVERNMENT SUPPORT

The U.S. Government has a paid-up license in this invention and the right in limited circumstances to require the patent owner to license others on reasonable terms as provided for by the terms of Contract Number N00014-83-K-0450 awarded by the Office of Naval Research.

FIELD OF THE INVENTION

This invention relates generally to light-emitting diodes and their fabrication. More particularly, it concerns light-emitting diodes fabricated from semiconducting (conjugated) polymers which are soluble in common organic solvents, and yet more particularly to the fabrication of such diodes on flexible polymer substrates.

BACKGROUND OF THE INVENTION

Solid-state light-emitting diodes (LEDs) have found widespread application in displays, as well as in a variety of less common applications. Currently, LEDs are fabricated from conventional semiconductors; for example, gallium arsenide (GaAs), typically doped with aluminum, indium, or phosphorus. Using this technology, it is very difficult to make large area displays. In addition, the LEDs made of these materials are typically limited to the emission of light at the long wavelength end of the visible spectrum. For these reasons, there has been considerable interest for many years in the development of suitable organic materials for use as the active (light-emitting) components of LEDs. (See references 1–6). The need for relatively high voltages (i.e., voltages incompatible with digital electronics) for the onset of light emission has been a hindrance to the commercialization of LEDs fabricated from organic materials.

The utilization of semiconducting organic polymers (i.e., conjugated polymers) in the fabrication of LEDs expands the use of organic materials in electroluminescent devices and expands the possible applications for conducting polymers into the area of active light sources, (see Reference 7) With the possibility of significant advantages over existing LED technology. Controlling the energy gap of the polymer, either through the judicious choice of the conjugated backbone structure or through side-chain functionalization, should make possible the emission of a variety of colors throughout the visible spectrum.

In the prior art, Tomozawa et al (see Reference 8) disclosed diodes fabricated by casting semiconducting polymers from solution.

Also in the art, Burroughs et al (see Reference 7) disclosed a multi-step process in the fabrication of LED structures characterized as follows:

1) A glass substrate is utilized. The substrate is pre-coated with a transparent conducting layer of indium/tin oxide (ITO). This ITO coating, having high work function serves as the ohmic hole-injecting electrode.

2) A soluble precursor polymer to the conjugated polymer, poly(phenylene vinylene), PPV, is cast from solution onto the substrate as a thin, semitransparent layer (approximately 100–200 nm).

3) The precursor polymer is converted to the final conjugated PPV by heat treating the precursor polymer (already formed as a thin film on the substrate) to temperatures in excess of 200° C. while pumping in vacuum.

4) The negative, electron-injecting contact is fabricated from a low work function metal such as aluminum, or magnesium-silver alloy; said negative electrode acting as the rectifying contact in the diode structure.

The resulting devices showed asymmetric current versus voltage curves indicative of the formation of a diode, and the diodes were observed to emit visible light under conditions of forward bias at bias voltages in excess of about 14 V with quantum efficiencies up to 0.05%.

The methods of Burroughs et al, therefore, suffer a number of specific disadvantages. Because of the use of a rigid glass substrate, the resulting LED structures are rigid and inflexible. The need for heating to temperatures in excess of 200° C. to convert the precursor polymer to the final conjugated polymer precludes the use of flexible transparent polymer substrates, such as, for example, polyethyleneterephthalate, polystyrene, polycarbonate and the like, for the fabrication of flexible LED structures with novel shapes and forms. The need for heating to temperatures in excess of 200° C. to convert the precursor polymer to the final conjugated polymer has the added disadvantage of possibly creating defects in the conjugated polymer and in particular at the upper surface of the conjugated polymer which forms the rectifying contact with the low work function metal.

Thus, the ability to fabricate light-emitting diodes from organic materials and in particular from polymers, remains seriously limited.

References

1. P. S. Vincent, W. A. Barlow, R. A. Hann and G. G. Roberts, Thin Solid Films, 94, 476 (1982).
2. C. W. Tang, S. A. Van Syke, Appl. Phys. Lett. 51, 913 (1987).
3. C. W. Tang, S. A. Van Syke and C. H. Chen, J. Appl. Phys. 65, 3610 (1989).
4. C. Adachi, S. Tokito, T. Tsutsui, and S. Saito, Appl. Phys. Lett. 55, 1489 (1989).
5. C. Adachi, S. Tokito, T. Tsutsui, and S. Saito, Appl. Phys. Lett. 56, 799 (1989).
6. M. Nohara, M. Hasegawa, C. Hosohawa, H. Tokailin, T. Kusomoto, Chem. Lett. 189 (1990).
7. J. H. Burroughs, D. D. C. Bradley, A. R. Brown, R. N. Marks, K. Mackay, R. H. Friend, P. L. Burns and A. B. Holmes, Nature 347, 539 (1990).
8. H. Tomozawa, D. Braun, S. D. Phillips, R. Worland, A. J. Heeger, and H. Kroemer, Synth. Met. 28, C687 (1989).
9. F. Wudl, P.-M. Allemand, G. Srdanov, Z. Ni, and D. McBranch, in Materials for Non-linear Optics: Chemical Perspectives (to be published in 1991).
10. S. M. Sze, Physics of Semiconductor Devices (John Wiley & Sons, New York, 1981).
11. a. T. W. Hagler, K. Pakbaz, J. Moulton, F. Wudl, P. Smith, and A. J. Heeger, Polym. Commun. (in press). b. T. W. Hagler, K. Pakbaz, K. Voss and A. J. Heeger, Phys. Rev. B. (in press).

SUMMARY OF THE INVENTION

It is accordingly an object of the present invention to overcome the aforementioned disadvantages of the prior art and, primarily, to provide light-emitting diodes fabricated from semiconducting polymers which are soluble in the conjugated form and therefore require no subsequent heat treatment at elevated temperatures.

It is additionally an object of the present invention to utilize the processing advantages associated with the fabrication of diode structures from soluble semiconductor polymers cast from solution to enable the fabrication of large active areas.

It is additionally an object of the present invention to provide light-emitting diodes fabricated from semiconducting polymers using flexible organic polymer substrates.

It is additionally an object of the present invention to provide methods for the fabrication of light-emitting diodes fabricated from semiconducting polymers which turn on at bias voltages compatible with digital electronics (i.e., at voltages less than 5 volts).

Additional objects, advantages and novel features of the invention will be set forth in part in the description which follows, and in part will become apparent to those skilled in the art on examination of the following, or may be learned by practice of the invention. The objects and advantages of the invention may be realized and attained by means of the instrumentalities and combinations particularly pointed out in the appended claims.

In one aspect this invention provides a process for fabricating light-emitting diodes (LEDs). In this embodiment the process involves a process for fabrication of light-emitting diodes which emit visible light. This process comprises the steps of:

i) precoating a substrate with a transparent conducting first layer having high work function and serving as an ohmic hole-injecting electrode;

ii) casting upon the first layer directly from solution, a thin transparent layer of a soluble conjugated polymer; and iii) fabricating a negative, electron-injecting contact onto the conjugated polymer film. This contact is formed from a low work function metal and acts as the rectifying contact in the diode structure.

In another embodiment, an alternative process for fabricating light-emitting diodes which emit visible light is provided. This process comprises the steps of:

i) casting a free-standing, semi-transparent film of a soluble conjugated polymer from solution, said film serving as a luminescent, semiconducting polymer and simultaneously as a substrate;

ii) coating the free-standing, conjugated polymer film on one side with a transparent conducting first layer having a high work function and serving as the ohmic hole-injecting electrode; and iii) fabricating a negative electron-injecting contact onto the other side of the conjugated polymer film. This contact is made of a low work function metal and acts as the rectifying contact in the diode structure.

In yet an additional embodiment this invention provides a process for making oriented polymer-based LEDs which emit polarized visible light. This process includes the steps of:

i) gel-processing a soluble conjugated polymer as a member of an admixture with ultra-high molecular weight carrier polymer. The gel-processed mixture is formed into an oriented, free-standing film in which the conjugated polymer is chain-aligned. This chain-aligning resulting in polarized luminescence for the polymer.

ii) coating the free-standing, oriented polymer film on one side with a transparent, conducting first layer having high work function and serving as an ohmic hole-injecting electrode, and iii) fabricating a negative, electron-injecting contact onto the other side of the conjugated polymer film. This contact is fabricated from a low work function metal and acts as the rectifying contact in the diode structure.

In another general aspect this invention provides the LEDs fabricated by any of these processes. In a more particular aspect of this invention, the LED devices employ poly(2-methoxy,5-(2-ethyl-hexyloxy)-1,4-phenylene vinylene), MEH-PPV, as the conjugated polymer. MEH-PPV offers the advantage of being a conjugated polymer which is soluble in organic solvents. LED device fabrication is simplified because of the direct casting of the conjugated polymer from solution.

Surprisingly, it was found that by using calcium as the low work function rectifying contact, and by using ITO coated PET films as the substrate, flexible LED structures are fabricated which benefit from the excellent mechanical properties of both the polymer substrate and the conjugated polymer semiconducting layer and which exhibit the advantageous characteristics of a turn-on voltage reduced to 3–4 volts (i.e TTL compatible), and a quantum efficiency which is improved by more than an order of magnitude to values of approximately 1%.

Specific advantages of this invention over the prior art include the following:

(i) Because the luminescent semiconducting polymer is soluble in its final conjugated form, there is no need for heat treatment at elevated temperatures. This greatly simplifies the fabrication procedure and enables a continuous manufacturing process.

(ii) Since the luminescent semiconducting polymer layer can be cast onto the substrate directly from solution at room temperature, the LED structure can be fabricated on a flexible transparent polymer substrate. These polymer films are manufactured as large area continuous films. Thus, the use of flexible polymer films as substrate enables the fabrication of large area polymer LEDs using either a batch process or a continuous process.

(iii) The use of Calcium as the low work function contact onto MEH-PPV as the luminescent polymer leads to unexpected improvements in the efficiency of the device and in the compatibility of the device with modern digital electronic circuitry.

DETAILED DESCRIPTION OF THE INVENTION

The Substrates

In some embodiments, the conjugated polymer-based LEDs are prepared on a substrate. The substrate should be transparent and nonconducting. It can be a rigid material such as a rigid plastic including rigid acrylates, carbonates, and the like, rigid inorganic oxides such as glass, quartz, sapphire, and the like. It can also be a flexible transparent organic polymer such as polyester—for example polyethyleneterephthalate, flexible polycarbonate, poly (methyl methacrylate), poly(styrene) and the like.

The thickness of this substrate is not critical.

The Conjugated Polymer

The invention provides LEDs based on conjugated polymers.

In one embodiment the conjugated polymer is cast directly from a solution onto a precooled substrate to form a substrate-supported film.

In another, the conjugated polymer is present as a free-standing film.

In a third embodiment, the conjugated polymer is present as a component of a gel-processed admixture with a carrier polymer and the film is formed from this admixture. This embodiment offers an easy way to obtain aligned conjugated polymer structures which lead to LEDs which can emit polarized light.

The conjugated polymers used herein include soluble conjugated polymers known in the art. These include, for example, poly(2-methoxy,5-(2'-ethylhexyloxy)-p-phenylenevinylene) or "MEH-PPV", P3ATs, poly(3-alkylthiophenes) (where alkyl is from 6 to 16 carbons), such as poly(2,5-dimethoxy-p-phenylene vinylene)-"PDMPV", and poly(2,5-thienylenevinylene); poly(phenylenevinylene) or "PPV" and alkoxy derivatives thereof; and polyanilines. Of these, the MEH-PPV materials are preferred. The preparation of MEH-PPV is given in the examples herein.

The conjugated polymer can be deposited or cast directly from solution. The solvent employed is one which will dissolve the polymer and not interfere with its subsequent deposition.

Typically, organic solvents are used. These can include halohydrocarbons such as methylene chloride, chloroform, and carbon tetrachloride, aromatic hydrocarbons such as xylene, benzene, toluene, other hydrocarbons such as decaline, and the like. Mixed solvents can be used, as well. Polar solvents such as water, acetone, acids and the like may be suitable. These are merely a representative exemplification and the solvent can be selected broadly from materials meeting the criteria set forth above.

When depositing the conjugated polymer on a substrate, the solution can be relatively dilute, such as from 0.1 to 20% w in concentration, especially 0.2 to 5% w. Film thicknesses of 50–400 and 100–200 nm are used.

The Carrier Polymer.

In some embodiments, the conjugated polymer is present in admixture with a carrier polymer.

The criteria for the selection of the carrier polymer are as follows. The material should allow for the formation of mechanically coherent films, at low concentrations, and remain stable in solvents that are capable of dispersing, or dissolving the conjugated polymers for forming the final film. Low concentrations of carrier polymer are preferred in order to minimize processing difficulties, i.e., excessively high viscosity or the formation of gross inhomogeneities; however the concentration of the carrier should be high enough to allow for formation of coherent structures. Preferred carrier polymers are high molecular weight (M.W.>100,000) flexible chain polymers, such as polyethylene, isotactic polypropylene, polyethylene oxide, polystyrene, and the like. Under appropriate conditions, which can be readily determined by those skilled in the art, these macromolecular materials enable the formation of coherent structures from a wide variety of liquids, including water, acids, and numerous polar and nonpolar organic solvents. Films or sheets manufactured using these carrier polymers have sufficient mechanical strength at polymer concentrations as low as 1%, even as low as 0.1%, by volume to enable the coating and subsequent processing as desired.

Mechanically coherent films can also be prepared from lower molecular weight flexible chain polymers, but generally, higher concentrations of these carrier polymers are required.

Selection of the carrier polymer is made primarily on the basis of compatibility of the conjugated polymer, as well as with the solvent or solvents used. For example, blending of polar conducting polymers generally requires carrier structures that are capable of co-dissolving with or absorbing polar reactants. Examples of such coherent structures are those comprised of poly(vinyl alcohol), poly(ethylene oxide), poly-para(phenylene terephthalate), poly-para-benzamide, etc., and suitable liquids. On the other hand, if the blending of the final polymer cannot proceed in a polar environment, nonpolar carrier structures are selected, such as those containing polyethylene, polypropylene, poly (butadiene), and the like.

Turning now to the issue of concentration, it is of crucial importance that the carrier structure formed have sufficient mechanical coherence for further handling during the formation of the final polymer blend. Therefore, the initial concentration of the carrier polymer generally is selected above 0.1% by volume, and more preferably above about 0.75% by volume. On the other hand, it is not desirable to select carrier polymer concentrations exceeding 90% by volume, because this has a diluting effect on the final conjugated polymer composite product. More preferably, the concentration of the carrier polymer in the solution is below 50% by volume, and still more preferably below. 25% by volume.

Thus, solution is provided by dissolving a selected carrier polymer and conjugated polymer in a compatible solvent (or mixed solvents) to a predetermined concentration (using the aforementioned guidelines). In the present process the "compatible solvent" is a solvent system into which a desired quantity of soluble conjugated polymer (or soluble precursor polymer) can be dissolved. The solvent system is also one in which the carrier polymer is substantially soluble, and will not interfere with the subsequent structure formation process. The carrier solution is formed into selected shape, e.g. a fiber, film or the like, by extrusion or by any other suitable method. The solvent is then removed (through evaporation, extraction, or any other convenient method).

Gels can be formed from the carrier conjugate solution in various ways, e.g., through chemical crosslinking of the macromolecules in solution, swelling of cross-linked macromolecules, thermoreversible gelation, and coagulation of polymer solutions. In the present invention, the two latter types of gel formation are preferred, although under certain experimental conditions, chemically crosslinked gels may be preferred.

Thermoreversible gelation refers to the physical transformation of polymer solution to polymer gel upon lower of the temperature of a homogeneous polymer solution (although in exceptional cases a temperature elevation may be required). This mode of polymer gelation requires the preparation of a homogeneous solution of the selected carrier polymer in an appropriate solvent according to standard techniques known to those skilled in the art. The polymer solution is cast or extruded into a fiber, rod or film form, and the temperature is lowered to below the gelation temperature of the polymer in order to form coherent gels. This procedure is well known and is commercially employed, e.g., for the formation of gels of high molecular weight polyethylene in decalin, paraffin oil, oligomeric polyolefins, xylene, etc., as precursors for high strength polyolefin fibers and films.

"Coagulation" of a polymer solution involves contacting the solution with a nonsolvent for the dissolved polymer, thus causing the polymer to precipitate. This process is well known, and is commercially employed, for example, in the formation of rayon fibers and films, and spinning of high-performance aramid fibers, etc.

Frequently, it is desirable to subject the carrier polymer/conducting polymer composite to mechanical deformation, typically by stretching, during or after the initial forming step. Deformation of polymeric materials is carried out in order to orient the macromolecules in the direction of draw, which results in improved mechanical properties. Maximum deformations of thermoreversible gels are substantially greater than melt processed materials.(P. Smith and P. J. Lemstra, Colloid and Polym. Sci., 258, 891, (1980).) The large draw ratios possible with thermoreversible gels are also advantageous if composite materials may be prepared with materials limited in their drawability due to low molecular weights. In the case of conducting polymers, not only do the mechanical properties improve, but, more importantly, the electrical conductivity also often displays drastic enhancement by tensile drawing and the orientation of the conjugated polymer gives rise to LEDs which will emit polarized light because of the orientation.

The Transparent Conducting First Layer.

The conjugated polymer layer of the LEDs of this invention is bounded on one surface by a transparent conducting first layer.

When a substrate is present, this layer is between the substrate and the conjugated polymer layer. This first layer is a transparent conductive layer made of a high work function material that is a material with a work function above 4.5 eV. This layer can be a film of an electronegative metal such as gold or silver, with gold being the preferred member of that group. It can also be formed of a conductive metal-metal oxide mixture such as indium-tin oxide.

These layers are commonly deposited by vacuum sputtering (RF or Magnetron) electron beam evaporation, thermal vapor deposition, chemical deposition and the like.

The ohmic contact layer should be low resistance: preferably less than 300 ohms/square and more preferably less than 100 ohms/square.

The Electron Injecting Contact

On the other side of the conjugated polymer film an electron-injecting contact is present. This is fabricated from a low work function metal or alloy (a low work function material has a work function below 4.3. Typical materials include indium, calcium, barium and magnesium, with calcium being a particularly good material. These electrodes are applied by using methods well-known to the art (e.g. evaporated, sputtered, or electron-beam evaporation) and acting as the rectifying contact in the diode structure.

EXAMPLES

This invention will be further described by the following examples. These are intended to embody the invention but not to limit its scope.

Example 1

This example involves the preparation of poly(2-methoxy, 5-(2'-ethylhexyloxy)-p-phenylenevinylene) "MEH-PPV".

Monomer Synthesis

1. Preparation of 1-Methoxy-4-(2-Ethyl-Hexyloxy)Benzene

A solution of 24.8 g (0.2 mole) of 4-methoxy phenol in 150 ml dry methanol was mixed under nitrogen with 2.5. M solution of sodium methoxide (1.1 equivalent) and refluxed for 20 min. After cooling the reaction mixture to room temperature, a solution of 2-ethylbromohexane (42.5 ml, 1.1 equivalent) in 150 ml methanol was added dropwise. After refluxing for 16 h, the brownish solution turned light yellow. The methanol was evaporated and the remaining mixture of the white solid and yellow oil was combined with 200 ml of ether, washed several times with 10% aqueous sodium hydroxide, $H_2O$ and dried over $MgSO_4$. After the solvent was evaporated, 40 g (85%) of yellow oil was obtained. The crude material was distilled under vacuum (2.2 mm Hg, b.p. 148–149° C.), to give a clear, viscous liquid. $^1$H NMR ($CDCl_3$) δ 6.98 (4H, s, aromatics), 3.8 (5H, t, O—$CH_2$, O—$CH_3$), 0.7–1.7 (15 H, m, $C_7H_{15}$. IR (NaCl plate) 750, 790, 825, 925, 1045, 1105, 1180, 1235, 1290, 1385, 1445, 1470, 1510, 1595, 1615, 1850, 2030, 2870, 2920, 2960, 3040. MS. Anal. Calc. for $C_{15}H_{24}O_2$: C, 76.23; H, 10.23; O, 13.54. Found: C, 76.38; H, 10.21; O, 13.45.

2. Preparation of 2,5-bis(Chloromethyl)-1-Methoxy-4-(2-Ethyl-Hexyloxy)Benzene

To the solution of 4.9 g (20.7 mmoles) of compound (1) in 100 ml p-dioxane cooled down to 0–5° C., 18 ml of conc. HCl, and 10 ml of 37% aqueous formalin solution was added. Anhydrous HCl was bubbled for 30 min, the reaction mixture warmed up to R.T. and stirred for 1.5–2 h. Another 10 ml of formalin solution was added and HCl gas bubbled for 5–10 min at 0–5° C. After stirring at R.T. for 16 h, and then refluxed for 3–4 h. After cooling and removing the solvents, an off-white "greasy" solid was obtained. The material was dissolved in a minimum amount of hexane and precipitated by adding methanol until the solution became cloudy. After cooling, filtering and washing with cold methanol, 3.4 g (52%) of white crystalline material (mp 52–54° C.) was obtained. $^1$H NMR ($CDCl_3$) δ 6.98 (2H, s, aromatics), 4.65 (4H, s, $CH_2$—Cl), 3.86 (5H, t, O—$CH_3$, O—$CH_2$), 0.9–1.5 (15H, m, $C_7H_{15}$), IR (KBr) 610, 700, 740, 875, 915, 1045, 1140, 1185, 1230, 1265, 1320, 1420, 1470, 1520, 1620, 1730, 2880, 2930, 2960, 3050. MS. Anal. Calc. for $C_{17}H_{26}O_2Cl_2$: C, 61.26; H, 7.86; O, 9.60; Cl, 21.27. Found: C, 61.31; h, 7.74; O, 9.72; Cl, 21.39.

Polymerization

Preparation of Poly(1-Methoxy-4-(2-Ethylhexyloxy-2,5-Phenylenevinylene) MEH-MPV

To a solution of 1.0 g (3 mmol) of 2,5-bis (chloromethyl)-methoxy-4-(2-ethylhexyloxy)benzene in 20 ml of anhydrous THF was added dropwise a solution of 2.12 g (18 mmol) of 95% potassium tert-butoxide in 80 ml of anhydrous THF at R.T. with stirring. The reaction mixture was stirred at ambient temperature for 24 h and poured into 500 ml of methanol with stirring. The resulting red precipitate was washed with distilled water and reprecipitated from THF/methanol and dried under vacuum to afford 0.35 g (45% yield). UV ($CHCl_3$) 500. IR (film) 695, 850, 960, 1035, 1200, 1250, 1350, 1410, 1460, 1500, 2840, 2900, 2940, 3040. Anal. Calc. for $C_{17}H_{24}O_2$: C, 78.46; H, 9.23. Found: C, 78.34; H, 9.26.

Molecular weight (GPC vs. polystyrene) $3 \times 10^5$. Inherent viscosity ~5 dl/g (but time dependent due to the tendency to form aggregates). As is the case with a few other stiff chain polymers, the viscosity increases with standing, particularly in benzene. The resulting solution is therefore thixotropic.

The conjugated polymer is highly colored (bright red-orange).

Example 2

Preparation of MEH-PPV via a precursor polymer route.

Monomer Synthesis

The monomer synthesis is exactly the same as in Example 1.

Polymerization of the Precursor Polymer and Conversion to MEH-PPV

A solution of 200 mg (0.39 mmol) of the monomer salt of Example 1 in 1.2 ml dry methanol was cooled to 0° C. for 10 min and a cold degassed solution of 28 mg (1.7 equivalents) of sodium hydroxide in 0.7 ml methanol was added slowly. After 10 min the reaction mixture became yellow and viscous. The above mixture was maintained at 0° C. for another 2–3 h and then the solution was neutralized. A very thick, gum-like material was transferred into a Spectrapore membrane (MW cutoff 12,000–14,000) and dialyzed in degassed methanol containing 1% water for 3 days. After drying in vacuo, 70 mg (47%) of "plastic" yellow precursor polymer material was obtained. UV (CHCl$_3$) 365. IR (film) 740, 805, 870, 1045, 1075, 1100, 1125, 1210, 1270, 1420, 1470, 1510, 2930, 2970, 3020. Soluble in C$_6$H$_5$Cl, C$_6$H$_3$Cl$_3$, CH$_2$Cl$_2$, CHCl$_3$, Et$_2$O, THF. Insoluble in MeOH.

The precursor polymer was converted to the conjugated MEH-PPV by heating to reflux (approx. 214° C.) in 1,2,4-trichlorobenzene solvent. The product was identical with the material obtained in Example 1.

Example 3

Light-emitting diodes (LEDs) were fabricated consisting of a rectifying indium (work function=4.2 eV, Reference 10) contact on the front surface of an MEH-PPV film which is deposited by spin-casting from dilute tetrahydrofuran solution containing 1% MEH-PPV by weight onto a glass substrate. The resulting MEH-PPV films have uniform surfaces with thicknesses near 1200 Å. The glass substrate had been previously coated with a layer of indium/tin-oxide to form an ohmic contact. The Indium contact is deposited on top of the MEH-PPV polymer film by vacuum evaporation at pressures below $4\times10^{-7}$ Torr yielding active areas of 0.04 cm$^2$.

While ramping the applied bias, yellow-orange light becomes visible to the eye just below 9 V forward bias (no light is observed under reversed bias). Above 15 V, the rectification ratio of the diode exceeds $10^4$.

The EL spectra, obtained with 3 V AC superposed (at 681 Hz) on 13V forward bias, showed characteristic spectral features similar to those observed in the photoluminescence of MEH-PPV.[11] The room temperature electroluminescence peaks near 2.1 eV with a hint of a second peak above 1.9 eV. At 90K, the intensity increases and shifts to the red, and the two peaks become clearly resolved.

The electroluminecence intensity was measured as a function of current flow under increasing forward bias. The quantum efficiency was determined with a calibrated Silicon photodiode and corrected for the spectral response and the solid angle of the collecting optics. The measured quantum efficiency at 0.8 mA is $\approx 5\times10^{31\ 4}$ photons per electron for Indium electrodes.

Example 4

Light-emitting diodes (LEDs) were fabricated consisting of a rectifying calcium (work function=3 eV, Reference 10) contact on the front surface of an MEH-PPV film which is deposited by spin-casting from dilute solution onto a glass substrate. The resulting MEH-PPV films have uniform surfaces with thicknesses near 1200 Å. The glass substrate has been partially coated with a layer of indium/tin-oxide to form an "ohmic" contact. The calcium contact is deposited on top of the MEH-PPV polymer film by vacuum evaporation at pressures below $4\times10^{-7}$ Torr yielding active areas of 0.04 cm$^2$.

For the calcium/MEH-PPV diodes, rectification ratios as high as $10^5$ are achieved.

While ramping the applied bias, yellow-orange light becomes visible to the eye just above 3 V forward bias (no light is observed under reversed bias). The quantum efficiency was determined with a calibrated Silicon photodiode and corrected for the spectral response and the solid angle of the collecting optics. The measured quantum efficiency at 0.8 mA is $\approx 7\times10^{-3}$ photons per electron for calcium electrodes (i.e., nearly 1%!!). The emission from the Calcium/MEH-PPV LEDs is bright and easily seen in a lighted room at 4V forward bias.

Example 5

Light-emitting diodes (LEDs) were fabricated consisting of a rectifying calcium (work function=3 eV, Reference 10) contact on the front surface of an MEH-PPV film which is deposited by spin-casting from dilute solution onto a flexible transparent polyethyleneterephthalate (PET) film (7 mils thickness) as substrate. The resulting MEH-PPV films on PET have uniform surfaces with thicknesses near 1200 Å. The PET substrate is pre-coated with a layer of indium/tin-oxide to form an "ohmic" contact. The calcium rectifying contact is deposited on top of the MEH-PPV polymer film by vacuum evaporation at pressures below $4\times10^{-7}$ Torr yielding active areas of 0.04 cm$^2$.

For the calcium/MEH-PPV/ITO/PET diodes, rectification ratios as high as $10^3$ are achieved.

While ramping the applied bias, yellow-orange light becomes visible to the eye above 3V forward bias (no light is observed under reversed bias). The quantum efficiency was determined with a calibrated Silicon photodiode and corrected for the spectral response and the solid angle of the collecting optics. The measured quantum efficiency at 5.5 $\mu$A is $4\times10^{-3}$ photons per electron for calcium electrodes. The emission from the calcium/MEH-PPV LEDs is bright and easily seen in a lighted room at 4V forward bias.

Example 6

MEH-PPV is cast onto a film of pure UHMW-PE which has been stretched to a moderate draw ratio (e.g. draw ratio >20, Reference 11). The MEH-PPV is observed to orient spontaneously along the draw direction; both the photo-absorption and the photoluminescence spectra are highly anisotropic. Since the luminescence spectrum is polarized with electric vector along the chain alignment direction, light-emitting diodes can be fabricated which emit polarized light.

Example 7

MEH-PPV was gel-processed and chain oriented as a guest in UHMW-PE. The gel-processing of conjugated polymer as a guest in a gel-processed blend involves three steps:

A. Co-solution with a suitable carrier polymer

B. Carrier Structure Formation

C. Drawing of the Carrier/Polymer blend.

Carrier Solution Preparation, Film Formation, Gelation, and Drawing.

PE-MEH-PPV blends are prepared by mixing MEH-PPV PPV (M$_W$=450,000) in xylene with UHMW polyethylene (Hostalen GUR 415; M$_W$=$4\times10^6$) in xylene such that the PE to solvent ratio was 0.75% by weight. This solution is thoroughly mixed and allowed to equilibrate in a hot oil bath at 126° C. for one hour. The solution is then poured onto a glass surface to cool, forming a gel which was allowed to dry (into a film). Films were then cut into strips and tensile-drawn over a hot pin at 110–120° C. Once processed in this manner, the films are oriented. The high work function and low work function electrodes are offered as in Examples 4 and 5, and LEDs result.

We claim:

1. A light-emitting diode which emits visible light and which turns on at voltages below 5 volts, comprising:
   i) a substrate;
   ii) a transparent conducting first layer coated onto said substrate, said first layer having high work function and serving as a hole-injecting electrode;
   iii) a transparent layer of a soluble semiconducting luminescent conjugated polymer fabricated onto the transparent conducting first layer; and
   iv) an electron-injecting contact fabricated from a low work function metal onto the semiconducting conjugated polymer layer.

2. The light-emitting diode of claim 1, wherein the substrate is a transparent, inorganic substrate.

3. The light-emitting diode of claim 1, wherein the substrate is a transparent, organic polymer substrate.

4. The light-emitting diode of claim 1, wherein the conducting first layer is an electronegative metal.

5. The light-emitting diode of claim 1, wherein the conducting first layer is a conductive metal-metal oxide mixture.

6. The light-emitting diode of claim 1, wherein the semiconducting conjugated polymer layer comprises poly (2-methoxy,5-(2'-ethylhexyloxy)-1,4-phenylenevinylene).

7. The light-emitting diode of claim 1, wherein the semiconducting conjugated polymer layer comprises a semiconducting conjugated polymer selected from the group consisting of soluble alkoxy derivatives of poly (phenylenevinylene).

8. The light-emitting diode of claim 1, wherein the conducting first layer comprises gold or silver.

9. The light-emitting diode of claim 1, wherein the conducting first layer comprises indium-tin oxide.

10. The light-emitting diode of claim 1, wherein the substrate comprises an organic polymer selected from the group consisting of polyesters, polycarbonates, polyacrylates, and polystyrenes.

11. A light-emitting diode which emits visible light and which turns on at voltages below 5 volts, comprising:
   i) a substrate;
   ii) a transparent conducting first layer coated onto said substrate, said first layer having high work function and serving as a hole-injecting electrode;
   iii) a transparent layer of a soluble semiconducting luminescent conjugated polymer fabricated onto the transparent conducting first layer; and
   iv) an electron-injecting contact fabricated from calcium or a lower work function alkaline earth metal onto the semiconducting conjugated polymer layer.

12. The light-emitting diode of claim 11, wherein the substrate is a transparent, inorganic substrate.

13. The light-emitting diode of claim 11, wherein the substrate is a transparent, organic polymer substrate.

14. The light-emitting diode of claim 11, wherein the substrate comprises an organic polymer selected from the group consisting of polyesters, polycarbonates, polyacrylates, and polystyrenes.

15. The light-emitting diode of claim 11, wherein the conducting first layer is a conductive metal-metal oxide mixture.

16. The light-emitting diode of claim 11, wherein the conducting first layer comprises indium-tin oxide.

17. The light-emitting diode of claim 11, wherein the conducting first layer is an electronegative metal.

18. The light-emitting diode of claim 11, wherein the conducting first layer comprises gold or silver.

19. The light-emitting diode of claim 11, wherein the semiconducting conjugated polymer layer comprises a semiconducting conjugated polymer selected from the group consisting of soluble alkoxy derivatives of poly (phenylenevinylene).

20. The light-emitting diode of claim 11, wherein the semiconducting conjugated polymer layer comprises poly (2-methoxy,5-(2'-ethylhexyloxy)-1,4-phenylenevinylene).

21. The light-emitting diode of claim 11, wherein electron-injecting contact is calcium.

22. The light-emitting diode of claim 11, wherein electron-injecting contact is barium.

23. A light-emitting diode which emits visible light and which turns on at voltages below 5 volts, comprising:
   i) a substrate;
   ii) a transparent conducting first layer coated onto said substrate, said first layer having high work function and serving as a hole-injecting electrode;
   iii) a transparent layer of a soluble semiconducting luminescent conjugated polymer fabricated onto the transparent conducting first layer; and
   iv) an electron-injecting contact fabricated from calcium onto the semiconducting conjugated polymer layer.

24. The light-emitting diode of claim 23, wherein the substrate is a transparent, inorganic substrate.

25. The light-emitting diode of claim 23, wherein the substrate is transparent, organic polymer substrate.

26. The light-emitting diode of claim 23, wherein the substrate comprises an organic polymer selected from the group consisting of polyesters, polycarbonates, polyacrylates, and polystyrenes.

27. The light-emitting diode of claim 23, wherein the conducting first layer is a conductive metal-metal oxide mixture.

28. The light-emitting diode of claim 23, wherein the conducting first layer comprises indium-tin oxide.

29. The light-emitting diode of claim 23, wherein the conducting first layer is an electronegative metal.

30. The light-emitting diode of claim 23, wherein the conducting first layer comprises gold or silver.

31. The light-emitting diode of claim 23, wherein the semiconducting conjugated polymer layer comprises poly (2-methoxy,5-(2'-ethylhexyloxy)-1,4-phenylenevinylene).

32. A light-emitting diode which emits visible light and which turns on at voltages below 5 volts, comprising:
   i) a substrate;
   ii) a transparent conducting first layer coated onto said substrate, said first layer having high work function and serving as a hole-injecting electrode;
   iii) a transparent layer of a soluble semiconducting luminescent conjugated polymer fabricated onto the transparent conducting first layer; and
   iv) an electron-injecting contact fabricated from barium onto the semiconducting conjugated polymer layer.

33. The light-emitting diode of claim 32, wherein the substrate is a transparent, inorganic substrate.

34. The light-emitting diode of claim 32, wherein the substrate is a transparent, organic polymer substrate.

35. The light-emitting diode of claim 32, wherein the substrate comprises an organic polymer selected from the group consisting of polyesters, polycarbonates, polyacrylates, and polystyrenes.

36. The light-emitting diode of claim 32, wherein the conducting first layer is a conductive metal-metal oxide mixture.

37. The light-emitting diode of claim 32, wherein the conducting first layer comprises indium-tin oxide.

38. The light-emitting diode of claim 32, wherein the conducting first layer is an electronegative metal.

39. The light-emitting diode of claim 32, wherein the conducting first layer comprises gold or silver.

40. The light-emitting diode of claim 32, wherein the semiconducting conjugated polymer layer comprises poly (2-methoxy,5-(2'-ethylhexyloxy)-1,4-phenylenevinylene).

41. A light-emitting diode which emits visible light and which turns on at voltages below 5 volts, comprising:
  i) a substrate;
  ii) a transparent conducting first layer coated onto said substrate, said first layer having high work function and serving as a hole-injecting electrode;
  iii) a transparent layer of a soluble semiconducting luminescent conjugated polymer selected from the group consisting of soluble alkoxy derivatives of poly (phenylenevinylene) fabricated onto the transparent conducting first layer; and
  iv) an electron-injecting contact fabricated from calcium or a lower work function alkaline earth metal onto the semiconducting conjugated polymer layer.

42. The light-emitting diode of claim 41, wherein the substrate is a transparent, inorganic substrate.

43. The light-emitting diode of claim 41, wherein the substrate is a transparent, organic polymer substrate.

44. The light-emitting diode of claim 41, wherein the substrate comprises an organic polymer selected from the group consisting of polyesters, polycarbonates, polyacrylates, and polystyrenes.

45. The light-emitting diode of claim 41, wherein the conducting first layer is a conductive metal-metal oxide mixture.

46. The light-emitting diode of claim 41, wherein the conducting first layer comprises indium-tin oxide.

47. The light-emitting diode of claim 41, wherein the conducting first layer is an electronegative metal.

48. The light-emitting diode of claim 41, wherein the conducting first layer comprises gold or silver.

49. The light-emitting diode of claim 41, wherein the semiconducting conjugated polymer layer comprises poly (2-methoxy,5-(2'-ethylhexyloxy)-1,4-phenyenevinylene).

50. The light-emitting diode of claim 41, wherein the electron-injecting contact is calcium.

51. The light-emitting diode of claim 41, wherein the electron-injecting contact is barium.

52. A light-emitting diode which emits visible light and which turns on at voltages below 5 volts, comprising:
  i) a substrate;
  ii) a transparent conducting first layer coated onto said substrate, said first layer having high work function and serving as a hole-injecting electrode;
  iii) a transparent layer of a soluble semiconducting luminescent conjugated polymer selected from the group consisting of soluble alkoxy derivatives of poly (phenylenevinylene) fabricated onto the transparent conducting first layer; and
  iv) an electron-injecting contact fabricated from calcium onto the semiconducting conjugated polymer layer.

53. The light-emitting diode of claim 52, wherein the substrate is a transparent, inorganic substrate.

54. The light-emitting diode of claim 52, wherein the substrate is a transparent, organic polymer substrate.

55. The light-emitting diode of claim 52, wherein the substrate comprises an organic polymer selected from the group consisting of polyesters, polycarbonates, polyacrylates, and polystyrenes.

56. The light-emitting diode of claim 52, wherein the conducting first layer is a conductive metal-metal oxide mixture.

57. The light-emitting diode of claim 52, wherein the conducting first layer comprises indium-tin oxide.

58. The light-emitting diode of claim 52, wherein the conducting first layer is an electronegative metal.

59. The light-emitting diode of claim 52, wherein the conducting first layer comprises gold or silver.

60. The light-emitting diode of claim 52, wherein the semiconducting conjugated polymer layer comprises poly (2-methoxy,5-(2'-ethylhexyloxy)-1,4-phenylenevinylene).

61. A light-emitting diode which emits visible light and which turns on at voltages below 5 volts, comprising:
  i) a substrate;
  ii) a transparent conducting first layer coated onto said substrate, said first layer having high work function and serving as a hole-injecting electrode;
  iii) a transparent layer of a soluble semiconducting luminescent conjugated polymer selected from the group consisting of soluble alkoxy derivatives of poly (phenylenevinylene) fabricated onto the transparent conducting first layer; and
  iv) an electron-injecting contact fabricated from barium onto the semiconducting conjugated polymer layer.

62. The light-emitting diode of claim 61, wherein the substrate is a transparent, inorganic substrate.

63. The light-emitting diode of claim 61, wherein the substrate is a transparent, organic polymer substrate.

64. The light-emitting diode of claim 61, wherein the substrate comprises an organic polymer selected from the group consisting of polyesters, polycarbonates, polyacrylates, and polystyrenes.

65. The light-emitting diode of claim 61, wherein the conducting fist layer is a conductive metal-metal oxide mixture.

66. The light-emitting diode of claim 61, wherein the conducting first layer comprises indium-tin oxide.

67. The light-emitting diode of claim 61, wherein the conducting first layer is an electronegative metal.

68. The light-emitting diode of claim 61, wherein the conducting first layer comprises gold or silver.

69. The light-emitting diode of claim 61, wherein the semiconducting conjugated polymer layer comprises poly (2-methoxy,5-(2'-ethylhexyloxy)-1,4-phenylenevinylene).

* * * * *